US008896342B2

(12) United States Patent
Jung

(10) Patent No.: US 8,896,342 B2
(45) Date of Patent: Nov. 25, 2014

(54) INTEGRATED CIRCUIT AND OPERATION METHOD THEREOF

(71) Applicant: SK Hynix Inc., Gyeonggi-do (KR)

(72) Inventor: Jong-Ho Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 69 days.

(21) Appl. No.: 13/840,939

(22) Filed: Mar. 15, 2013

(65) Prior Publication Data

US 2014/0145754 A1    May 29, 2014

(30) Foreign Application Priority Data

Nov. 29, 2012    (KR) .................. 10-2012-0137186

(51) Int. Cl.
*H03K 19/003* (2006.01)
*H03K 19/00* (2006.01)

(52) U.S. Cl.
CPC ................................. *H03K 19/0005* (2013.01)
USPC .............................................. 326/30; 326/26

(58) Field of Classification Search
CPC .................. H03K 19/0005; H03K 19/017545; H04L 25/0278
USPC ............................................ 326/21, 22, 26, 30
See application file for complete search history.

(56) References Cited

U.S. PATENT DOCUMENTS

| 7,285,979 B2 * | 10/2007 | Janzen et al. | 326/30 |
| 2008/0030221 A1 * | 2/2008 | Lee et al. | 326/30 |
| 2009/0309628 A1 * | 12/2009 | Hyun et al. | 326/30 |
| 2012/0169370 A1 * | 7/2012 | Oh | 326/30 |

FOREIGN PATENT DOCUMENTS

KR    1020100102924    9/2010

* cited by examiner

*Primary Examiner* — Don Le
(74) *Attorney, Agent, or Firm* — IP & T Group LLP

(57) ABSTRACT

An integrated circuit of a multiple die package structure having a plurality of semiconductor devices, each of the plurality of semiconductor devices may include an active termination circuit configured to perform an active termination operation to the semiconductor device, and to be turned off in a disable state of an active termination setting code, a multiple die package information transfer unit configured to transfer a multiple die package information signal, and a compulsory termination unit configured to selectively convert the active termination setting code into the disable state in response to the multiple die package information signal.

12 Claims, 4 Drawing Sheets

FIG. 1
(PRIOR ART)

|  | DDR3 | DDR4 |
|---|---|---|
|  |  | RTT_PARK |
| ODT=L | ODT OFF | RTT_NOM or RTT_WR |
| ODT=H | RTT_NOM or RTT_WR |  |

MR1 (DDR3, DDR4)

| A9 | A6 | A2 | RTT_NOM |
|---|---|---|---|
| 0 | 0 | 0 | RTT_NOM Disable |
| 0 | 0 | 1 | RZQ/4 |
| 0 | 1 | 0 | RZQ/2 |
| 0 | 1 | 1 | RZQ/6 |
| 1 | 0 | 0 | RZQ/1 |
| 1 | 0 | 1 | RZQ/5 |
| 1 | 1 | 0 | RZQ/3 |
| 1 | 1 | 1 | RZQ/7 |

|  | ODT OFF METHOD |
|---|---|
| DDR3 | ODT=L or RTT_NOM/RTT_WR disable |
| DDR4 | RTT_NOM/RTT_WR/RTT_PARK disable |

MR1 (DDR3, DDR4)

| A10 | A9 | RTT_WR |
|---|---|---|
| 0 | 0 | Dynamic ODT OFF |
| 0 | 1 | RZQ/4 |
| 1 | 0 | RZQ/2 |
| 1 | 1 | Reserved |

MR5 (DDR4)

| A8 | A7 | A6 | RTT_PARK |
|---|---|---|---|
| 0 | 0 | 0 | RTT_PARK Disable |
| 0 | 0 | 1 | RZQ/4 |
| 0 | 1 | 0 | RZQ/2 |
| 0 | 1 | 1 | RZQ/6 |
| 1 | 0 | 0 | RZQ/1 |
| 1 | 0 | 1 | RZQ/5 |
| 1 | 1 | 0 | RZQ/3 |
| 1 | 1 | 1 | RZQ/7 |

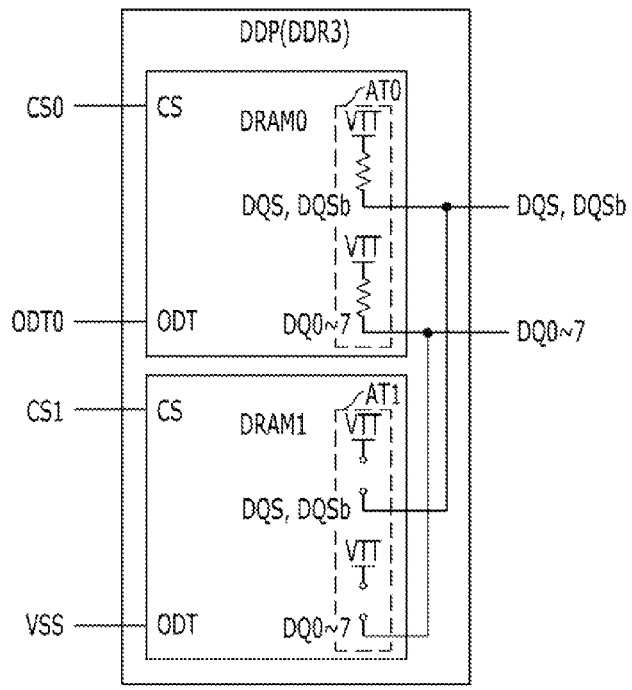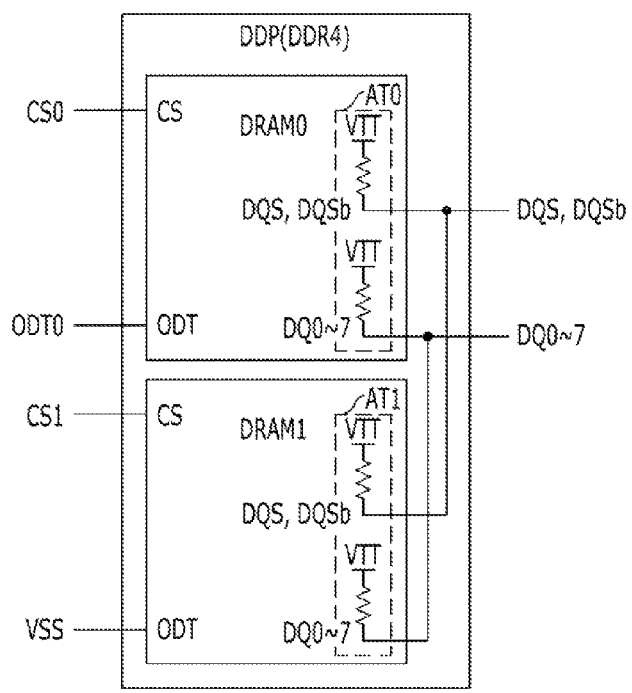

INTEGRATED CIRCUIT AND OPERATION METHOD THEREOF

CROSS-REFERENCE TO RELATED APPLICATIONS

The present invention claims priority of Korean patent application number 10-2012-0137186, filed on Nov. 29, 2012, which is incorporated by reference in its entirety.

BACKGROUND

1. Field

Exemplary embodiments of the present invention relate to a semiconductor design technology, more particularly, to an integrated circuit of a multiple die package structure including a plurality of semiconductor devices having on-die termination (ODT) circuits.

2. Description of the Related Art

An electronic system includes a controller and a semiconductor device that communicate with each other through at least one system bus. The system bus is used as a transmission line. Thus, a system bus is generally designed based on a signal reflection related to a device coupled to the transmission line. The transmission line is terminated using a resistor coupled between the transmission line and a power node.

In an external system such as a computer, a termination may be provided by an external resistor arranged on a motherboard of the computer. The external resistor having an impedance matched with an impedance of a transmission line is selected and terminates the transmission line such as a signal coupling line coupled to a plurality of integrated circuits. When the external resistor is matched with the impedance of the transmission line, a signal reflection is nearly nonexistent. But, the external resistor arranged on a system motherboard occupies a large space of the system board.

An on-chip termination (OCT) or on-die termination (ODT) as an activation termination instead of an external resistor may be used in an integrated circuit of a system. The active termination represents that a termination resistor is inserted into an internal part of a semiconductor device, and a controller and a termination resistance value is varied by turning on/off the termination resistor. Here, a value of the termination resistor may be controlled by a controller using an internal setting method of a semiconductor device such as a mode register set (MRS).

Moreover, it may be requested to turn off the active termination to minimize a current consumption according to an operation of a semiconductor device. For this operation, in a conventional art, termination setting values may be converted to '0' in the MRS, or an operation signal of the active termination, which is inputted to the semiconductor device, may be disabled. Here, the latter is preferable compared to the former.

That is, when the operation signal of the active termination is enabled, the active termination operation is included in an operation of the semiconductor device. But, when the operation signal of the active termination is disabled or termination setting values of the MRS are converted to '0' while the operation signal of the active termination is enabled, the active termination operation is not included in the operation of the semiconductor device.

Meanwhile, a semiconductor device, which operates at a high speed, reduces a switching noise of an input/output signal using a power supply voltage termination (VDDQ termination). According to the power supply voltage termination, an operation of the active termination circuit does not consume a current and it is not necessary to turn off the active termination circuit even though it is necessary to turn off the active termination operation.

Thus it is more effective to use a disable state of the operation signal of the active termination for adjusting a resistance value of the active termination circuit than turning off the active termination operation, in the semiconductor device with the power supply voltage termination. In fact, setting values of the termination setting codes of the MRS is only way to effectively turn off the active termination operation in the semiconductor device with the power supply voltage termination, regardless of the disable state of the operation signal of the active termination.

FIG. 1 is a table illustrating a comparison between active termination operations between a semiconductor device with an active termination circuit, and a semiconductor device with the power supply voltage termination as well as the active termination circuit.

For reference, an example of the semiconductor device with the active termination circuit is a double data rate three (DDR3) synchronous dynamic random access memory (SDRAM), and an example of the semiconductor with the power supply voltage termination as well as the active termination circuit is a DDR4 SDRAM. FIG. 1 compares specifications between the DDR3 SDRAM and the DDR4 SDRAM.

Referring to FIG. 1, in case of the DDR3 SDRAM, when an operation signal ODT of an active termination is disabled to logic LOW, an active termination operation is turned off, but when the operation signal ODT of the active termination is enabled to logic HIGH, termination resistance values are adjusted by termination setting codes A10, A9, A6 and A2 of MRS. When the values of the termination setting codes A10, A9, A6 and A2 of MRS are set to '0', the active termination operation is turned off.

FIG. 1 shows two different MRS settings for ODT well-known in the field of the present invention: RTT_NOM (nominal on-die termination) mode and RTT_WR (dynamic on-die termination) mode, where the value of the termination resistance code can be set to turn off the active termination operation.

In case of the DDR4 SDRAM, when an operation signal ODT of an active termination is enabled to logic HIGH, the active termination operation is turned off due to the values of the termination setting codes A10, A9, A6 and A2 of MRS, which are set to '0'. When the operation signal ODT of the active termination is disabled to logic LOW, however, another well-known ODT operation mode RTT_PARK is performed without turn-off of the active termination operation. In the RTT_PARK mode, the active termination operation is turned off due to the values of the termination setting codes A8, A10, A9, A6 and A2 of MRS set to '0'.

As described above, in case of a conventional semiconductor device using the power supply voltage termination, in order to turn off the active termination operation, the values of the termination setting codes of the MRS should be set regardless of disablement of the operation signal ODT of the active termination.

The fact that setting of the MRS should be involved regardless of disablement of the operation signal to turn off the active termination operation in the semiconductor device with the power supply voltage termination raises a concern in a case that a plurality of semiconductor devices with the power supply voltage termination are arranged with a multiple die package.

FIG. 2A is a block diagram illustrating a conventional integrated circuit of the multiple die package structure including a plurality of semiconductor devices having the active termination circuit. FIG. 2B is a block diagram illustrating a conventional integrated circuit of the multiple die package structure including a plurality of semiconductor devices with the power supply voltage termination as well as the active termination circuit.

FIGS. 2A and 2B illustrate exemplary semiconductor devices that are the DDR3 SDRAM and the DDR4 SDRAM, respectively.

Referring to FIG. 2A, the plurality of semiconductor devices DRAM0 and DRAM1, which are DDR3 SDRAMs, share signal transmission lines DQS, DQSb and DQ0~7. Active termination circuits AT0 and AT1 are included in each of the plurality of semiconductor devices DRAM0 and DRAM1. Each of the plurality of semiconductor devices DRAM0 and DRAM1 has a pad ODT for receiving an active termination operation signal ODT0 or VSS.

In the multiple die package structure of DDR3 SDRAMs, the plurality of semiconductor devices DRAM0 and DRAM1 share the signal transmission lines DQS, DQSb and DQ0-7, and thus it is not necessary to operate all of the active termination circuits AT0 and AT1 included in each of the plurality of semiconductor devices DRAM0 and DRAM1. Since the active termination operation is performed for an impedance matching with an external device, one of the plurality of semiconductor devices DRAM0 and DRAM1 is sufficient to perform the active termination operation and the rest of the plurality of semiconductor devices DRAM0 and DRAM1 needs not perform the active termination operation.

Thus, in case of a multiple die package structure of DDR3 SDRAMs, according to the active termination operation signal ODT0 that is enabled, a first semiconductor device DRAM0 of the plurality of semiconductor devices DRAM0 and DRAM1 shown in FIG. 2A performs the active termination operation. Whereas, according to the active termination operation signal VSS that is disabled, a second semiconductor device DRAM1 of the plurality of semiconductor devices DRAM0 and DRAM1 does not perform the active termination operation.

That is, in case of an integrated circuit of a multiple die package structure including a plurality of semiconductor devices having an active termination circuit, such as DDR3 SDRAMs, it is possible to simply turn off the active termination operation by adjusting an enable state or disable state of the active termination operation signal (ODT0 or VSS) that is input to each of the plurality of the semiconductor devices DRAM0 and DRAM1.

Referring to FIG. 2B, the plurality of semiconductor devices DRAM0 and DRAM1, which are DDR4 SDRAMs, share signal transmission lines DQS, DQSb and DQ0~7. Active termination circuits AT0 and AT1 are included in each of the plurality of semiconductor devices DRAM0 and DRAM1. Each of the plurality of semiconductor devices DRAM0 and DRAM1 has a pad for receiving an active termination operation signal ODT.

In the multiple die package structure of DDR4 SDRAMs, the plurality of semiconductor devices DRAM0 and DRAM1 share the signal transmission lines DQS, DQSb and DQ0~7, and thus it is not necessary to operate all of the active termination circuits AT0 and AT1 included in each of the plurality of semiconductor devices DRAM0 and DRAM1. Since the active termination operation is performed for an impedance matching with an external device, one of the plurality of semiconductor devices DRAM0 and DRAM1 is sufficient to perform the active termination operation and the rest of the plurality of semiconductor devices DRAM0 and DRAM1 needs not perform the active termination operation.

However, in case of the multiple die package structure having the plurality of semiconductor devices DRAM0 and DRAM1 shown in FIG. 2B, setting of the MRS in each and every semiconductor device DRAM0 and DRAM1 should be involved regardless of the enable state or disable state of the active termination operation signal (ODT0 or VSS) to turn off the active termination operation in the semiconductor device with the power supply voltage termination, such as the DDR4 SDRAM, as described above in connection with FIG. 1. The enable state or disable state of the active termination operation signal (ODT0 or VSS) is not sufficient to control the active termination operation of each and every semiconductor device DRAM0 and DRAM1, such as DDR4 SDRAMs, of the multiple die package.

It is possible to turn off the active termination operation of one of semiconductor devices DRAM0 and DRAM1 shown in FIG. 2B by adjusting a setting value of the MRS of one of the semiconductor devices DRAM0 and DRAM1. However, it is not easy for a controller to set the MRS in each of semiconductor devices DRAM0 and DRAM1 to turn off the active termination operation of one of the semiconductor devices DRAM0 and DRAM1 included in the multiple die package structure. This may cause a deterioration of the performance of a semiconductor system.

That is, in case of an integrated circuit of a multiple die package structure including a plurality of semiconductor devices having an active termination circuit using a power supply voltage termination, since it is impossible to independently control turn-off of the active termination operation of each of the plurality of semiconductor devices by adjusting an enable state of the active termination operation signal that is input to each of the semiconductor devices, the MRS of each of the semiconductor devices has to be adjusted to turn off the active termination operation.

SUMMARY

Exemplary embodiments of the present invention are directed to provide an integrated circuit for independently turning off an operation of an active termination circuit included in each of a plurality of semiconductor devices using a power supply voltage termination in case of an integrated circuit of a multiple die package structure including the plurality of semiconductor devices.

In accordance with an aspect of the present invention, an integrated circuit of a multiple die package structure having a plurality of semiconductor devices, each of the plurality of semiconductor devices may include an active termination circuit configured to perform an active termination operation to the semiconductor device, and to be turned off according to a disable state of an active termination setting code, a multiple die package information transfer unit configured to transfer a multiple die package information signal, and a compulsory termination unit configured to selectively convert the active termination setting code into the disable state in response to the multiple die package information signal.

In accordance with another aspect of the present invention, an operation method of each of a plurality of semiconductor devices included in an integrated circuit of a multiple die package structure, wherein each of the plurality of semiconductor devices may include an active termination circuit that performs an active termination operation to the semiconductor device and is controlled by an active termination setting code, may include determining an enable state of a multiple die package information signal, turning off the active termination circuit by converting the active termination setting code into a disable state, if the multiple die package information signal is enabled, performing the active termination operation according to the active termination setting code, if the multiple die packaging information signal is disabled.

BRIEF DESCRIPTION OF THE DRAWINGS

FIG. 1 is a table illustrating a comparison between active termination operations between a semiconductor device with an active termination circuit and a semiconductor device with a power supply voltage termination as well as the active termination circuit.

FIG. 2A is a block diagram illustrating a conventional integrated circuit of a multiple die package structure including a plurality of semiconductor devices having an active termination circuit.

FIG. 2B is a block diagram illustrating a conventional integrated circuit of a multiple die package structure including a plurality of semiconductor devices with a power supply voltage termination as well as an active termination circuit.

DETAILED DESCRIPTION

Figure 3:
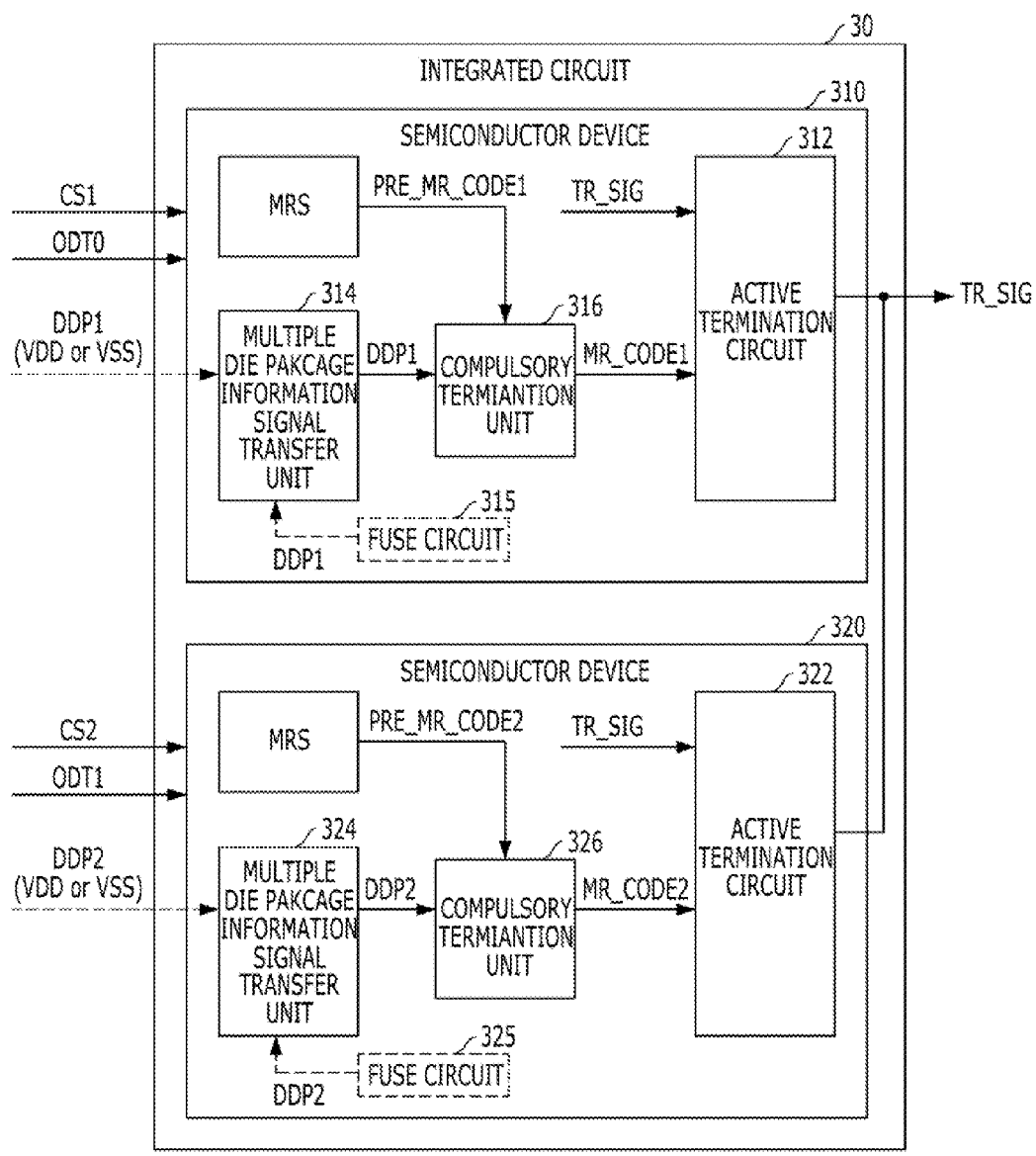
FIG. 3 is a block diagram illustrating an integrated circuit of a multiple die package structure including a plurality of semiconductor devices having an active termination circuit using a power supply voltage termination in accordance with an embodiment of the present invention.

Other objects and advantages of the present invention may be understood by the following description, and become apparent with reference to the embodiments of the present invention.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 3 is a block diagram illustrating an integrated circuit of a multiple die package structure including a plurality of semiconductor devices having an active termination circuit using a power supply voltage termination in accordance with an embodiment of the present invention.

Referring to FIG. 3, an integrated circuit 30 in accordance with an embodiment of the present invention includes a multiple die package structure having a plurality of semiconductor devices 310 and 320. The plurality of semiconductor devices 310 and 320 input and output a transmission signal TR_SIG through signal transmission lines that are shared. The plurality of semiconductor devices 310 and 320 include active termination circuits 312 and 322, multiple die package information signal transfer units 314 and 324, compulsory termination units 316 and 326, respectively. The devices 310 and 320 may have pads for receiving active termination operation signals ODT0 and ODT1, respectively.

As described above in connection with FIG. 2B, the enable state or disable state of the active termination operation signals ODT0 and ODT1 is not sufficient to control the active termination operation of each of the plural semiconductor devices having the active termination circuit using the power supply voltage termination, such as DDR4 SDRAMs, of the multiple die package.

The active termination circuits 312 and 322 are turned off in response to a disable state of active termination setting codes MR_CODE1 and MR_CODE2, respectively. More specifically, when the active termination setting codes MR_CODE1 and MR_CODE2 are set to predetermined values indicating the disable state, the active termination circuits 312 and 322 are turned off and do not perform the active termination operation in response to the disable state of the active termination setting codes MR_CODE1 and MR_CODE2. When the active termination setting codes MR_CODE1 and MR_CODE2 are set to values different from the predetermined values, which means that the active termination setting codes MR_CODE1 and MR_CODE2 have an enable state, the active termination circuits 312 and 322 are turned on and performs the active termination operation in response to the enable state of the active termination setting codes MR_CODE1 and MR_CODE2.

Here, the active termination setting codes MR_CODE1 and MR_CODE2 represent termination setting codes of the MRS included in each of the plurality of semiconductor devices 310 and 320 such as A10, A9, A8, A7, A6 and A2 shown in FIG. 1.

The compulsory termination units 316 and 326 selectively disable the active termination setting codes MR_CODE1 and MR_CODE2 in response to multiple die package information signals DDP1 and DDP2 from the multiple die package information signal transfer units 314 and 324, respectively. According to the multiple die package information signals DDP1 and DDP2, the compulsory termination units 316 and 326 may transfer termination setting codes PRE_MR_CODE1 and PRE_MR_CODE2 outputted from a mode register set (MRS) as the active termination setting codes MR_CODE1 and MR_CODE2, or may disable the active termination setting codes MR_CODE1 and MR_CODE2 regardless of values of predetermined termination setting codes PRE_MR_CODE1 and PRE_MR_CODE2, respectively.

When the multiple die package information signals DDP1 and DDP2 are enabled, the compulsory termination units 316 and 326 stop the active termination circuits 312 and 322 performing the active termination operation by sending the active termination setting codes MR_CODE1 and MR_CODE2 that have disable states, regardless of the predetermined termination setting codes PRE_MR_CODE1 and PRE_MR_CODE2, respectively.

When the multiple die package information signals DDP1 and DDP2 are disabled, the compulsory termination units 316 and 326 transfer the termination setting codes PRE_MR_CODE1 and PRE_MR_CODE2 to the active termination circuits 312 and 322, which means that the termination setting codes PRE_MR_CODE1 and PRE_MR_CODE2 are transferred as the active termination setting codes MR_CODE1 and MR_CODE2. Thus, variation of the predetermined termination setting codes PRE_MR_CODE1 and PRE_MR_CODE2 set by the MRS is reflected to the active termination circuits 312 and 322 to adjust a termination resistance value. Operations of the compulsory termination units 316 and 326 and the active termination circuits 312 and 322 in each of the plurality of semiconductor devices 310 and 320 may be independent from each other.

The multiple die package information signal transfer units 314 and 324 transfer the received multiple die package information signals DDP1 and DDP2 to the compulsory termination units 316 and 326. The multiple die package information signal transfer units 314 and 324 may receive multiple die package information signals DDP1 and DDP2 generated from an external device or fuse circuits 315 and 325 of the semiconductor devices 310 and 320, respectively.

To receive the multiple die package information signals DDP1 and DDP2 from the external device, the plurality of semiconductor devices 310 and 320 may have predetermined pads formed thereon, which may be dummy pads.

As shown in FIG. 3, the multiple die package information signals DDP1 and DDP2 may be enabled by application of a power supply voltage VDD to the predetermined pads, and may be disabled by application of a ground voltage VSS to the predetermined pads, respectively. The control of the multiple die package information signals DDP1 and DDP2 may be independent from each other.

In case that the multiple die package information signals DDP1 and DDP2 are generated in fuse circuits 315 and 325, each of the fuse circuits 315 and 325 may have information of one bit indicating the state of the multiple die package information signal DDP1 or DDP2, and may generate the multiple die package information signal DDP1 or DDP2 whose enable state is determined according to rupture of the fuse circuit 315 or 325. Rupture of the fuse circuits 315 and 325, and thus control of the multiple die package information signals DDP1 and DDP2 may be independent from each other.

As described above, the plurality of semiconductor devices 310 and 320 determine whether or not the multiple die package information signals DDP1 and DDP2 are enabled, and also determine turn off of the active termination operation based on a determined result, respectively and independently.

According to the embodiment of the present invention, the plurality of semiconductor devices 310 and 320 may control the active termination operation independently regardless of the enable state or disable state of the active termination operation signals ODT0 and ODT1. Therefore, it is possible for one of the plurality of semiconductor devices to perform the active termination operation, and possible for the rest of the plurality of semiconductor devices to not perform the active termination operation in the case of the integrated circuit of the multiple die package structure including the plurality of semiconductor devices having the active termination circuit using the power supply voltage termination.

Figure 4:
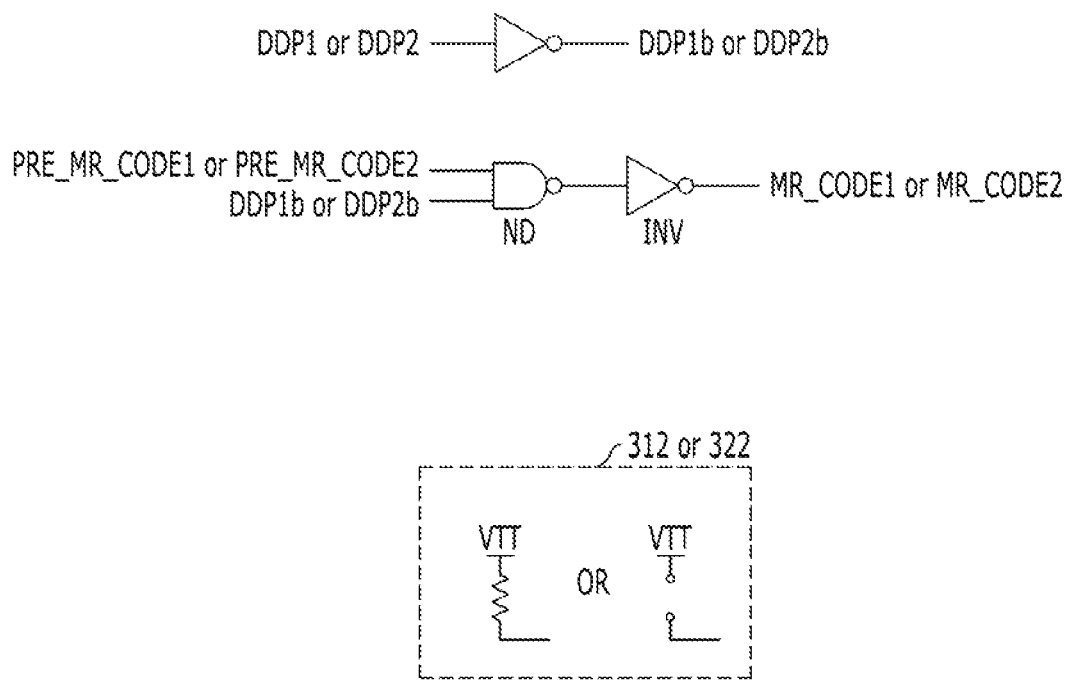
FIG. 4 is a circuit diagram illustrating a detailed configuration of a compulsory termination unit shown in FIG. 3 in accordance with an embodiment of the present invention.

FIG. 4 is a circuit diagram illustrating a detailed configuration of the compulsory termination unit shown in FIG. 3 in accordance with an embodiment of the present invention.

Referring to FIG. 4, the compulsory termination units 316 and 326 disable values of the active termination setting codes MR_CODE1 and MR_CODE2 in response to an enable state of the multiple die package information signals DDP1 and DDP2, respectively.

More specifically, each of the compulsory termination units 316 and 326 includes an inverter and an NAND gate.

The inverter inverts the multiple die package information signal DDP1 or DDP2 and outputs an inverted multiple die package information signal DDP1b or DDP2b. The NAND gate performs an NAND operation of the inverted multiple die package information signal DDP1b or DDP2b and the predetermined termination setting code PRE_MR_CODE1 or PRE_MR_CODE2 outputted from the MRS, and generates and outputs the active termination setting code MR_CODE1 or MR_CODE2 to the active termination circuit 312 or 322.

Thus, when the multiple die package information signals DDP1 and DDP2 are enabled to logic HIGH, the active termination setting codes MR_CODE1 and MR_CODE2 are disabled and transferred to the active termination circuits 312 and 322 irrespective of the values of the predetermined termination setting codes PRE_MR_CODE1 and PRE_MR_CODE2 that are outputted from the MRS.

When the multiple die package information signals DDP1 and DDP2 are disabled to logic LOW, the predetermined termination setting codes PRE_MR_CODE1 and PRE_MR_CODE2 are transferred to the active termination circuits 312 and 322 as the active termination setting codes MR_CODE1 and MR_CODE2.

As described above, according to the embodiment of the present invention, in case of an integrated circuit of a multiple die package structure including a plurality of semiconductor devices having an active termination circuit using a power supply voltage termination, the active termination circuit may be turned off based on a signal indicating that the packaging type of the integrated circuit is the multiple die package or the multiple die package information signals, and thus the active termination circuit in each of the plurality of semiconductor devices may be turned off independently according to the multiple die package structure. Therefore, it is possible for one of the plurality of semiconductor devices to perform the active termination operation, and possible for the rest of the plurality of semiconductor devices to not perform the active termination operation.

Further, since the signal indicating that the packaging type of the integrated circuit is the multiple die package may be controlled independently through a fuse circuit or from an external device via a dummy pad, the active termination circuit in each of the plurality of semiconductor devices may be turned off independently with a simple control using the fuse circuit or the dummy pad.

According to the embodiment of the present invention, an operation method in each of the plurality of semiconductor devices 310 and 320 of the integrated circuit 30 shown in FIGS. 3 and 4 may be performed. The method may include determining an enable state of a multiple die package information signal, if the multiple die package information signal is enabled, turning off the active termination circuit by converting the active termination setting code into a disable state, and if the multiple die packaging information signal is disabled, performing the active termination operation according to the active termination setting code. The active termination setting code may indicate the disable state when the active termination setting code is set to a predetermined value. The turning off of the active termination circuit may convert the active termination setting code into the predetermined value in response to the enable state of the multiple die package information signal. The enable state of the multiple die package information signal may be determined in response to an activation of a signal that is applied to a predetermined pad of the corresponding semiconductor device. The enable state of the multiple die package information signal may be determined in response to an activation of a signal outputted from a predetermined fuse circuit.

While the present invention has been described with respect to the specific exemplary embodiments, it will be apparent to those skilled in the art that various changes and modifications may be made without departing from the spirit and scope of the invention as defined in the following claims.

For example, a logic gate and a transistor shown in the exemplary embodiment of the present invention may be implemented with a different position according to a polarity of an input signal.

What is claimed is:

1. An integrated circuit of a multiple die package structure having a plurality of semiconductor devices, each of the plurality of semiconductor devices comprising:
   an active termination circuit configured to perform an active termination operation to the semiconductor device, and to be turned off according to a disable state of an active termination setting code;
   a multiple die package information transfer unit configured to transfer a multiple die package information signal; and
   a compulsory termination unit configured to selectively convert the active termination setting code into the disable state in response to the multiple die package information signal.

2. The Integrated circuit of claim 1, wherein the active termination setting code indicates the disable state when the active termination setting code is set to a predetermined value.

3. The Integrated circuit of claim 2, wherein the compulsory termination unit converts the active termination setting code into the predetermined value in response to an enable state of the multiple die package information signal.

4. The integrated circuit of claim 1, wherein the multiple die package information signal transfer unit outputs the multiple die package information signal as a signal, which is applied from a predetermined pad.

5. The integrated circuit of claim 1, wherein the multiple die package information signal transfer unit outputs the multiple die package information signal as a signal, and a logic level of the signal is determined by a predetermined fuse circuit.

6. The integrated circuit of claim 1, wherein the active termination circuit is turned off at the disable state and does not perform any operation if the active termination setting code is set to a predetermined value, and is turned on at an enable state and adjust a termination resistance value in response to a value of the active termination setting code if the active termination setting code is not set to a predetermined value.

7. The integrated circuit of claim 6, wherein the compulsory termination unit controls the active termination circuit to not perform any operation by converting the active termination setting code into the predetermined value in response to an enable state of the multiple die package information signal.

8. An operation method of each of a plurality of semiconductor devices included in an integrated circuit of a multiple die package structure, wherein each of the plurality of semiconductor devices includes an active termination circuit that performs an active termination operation to the semiconductor device and is controlled by an active termination setting code, the operation method comprising:
   determining an enable state of a multiple die package information signal;
   turning off the active termination circuit by converting the active termination setting code into a disable state, if the multiple die package information signal is enabled;
   performing the active termination operation according to the active termination setting code, if the multiple die packaging information signal is disabled.

9. The operation method of claim 8, wherein the active termination setting code indicates the disable state when the active termination setting code is set to a predetermined value.

10. The operation method of claim 9, wherein the turning off of the active termination circuit converts the active termination setting code into the predetermined value in response to the enable state of the multiple die package information signal.

11. The operation method of claim 8, wherein the determining of the enable state determines the enable state of the multiple die package information signal in response to an activation of a signal that is applied to a predetermined pad of the corresponding semiconductor device.

12. The operation method of claim 8, wherein the determining of the enable state determines the enable state of the multiple die package information signal in response to an activation of a signal outputted from a predetermined fuse circuit.

* * * * *